(12) United States Patent
Interrante et al.

(10) Patent No.: US 9,059,241 B2
(45) Date of Patent: Jun. 16, 2015

(54) 3D ASSEMBLY FOR INTERPOSER BOW

(71) Applicant: International Business Machines Corporation, Armonk, NY (US)

(72) Inventors: Mario J. Interrante, Hopewell Junction, NY (US); Katsuyuki Sakuma, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 13/753,025

(22) Filed: Jan. 29, 2013

(65) Prior Publication Data

US 2014/0209666 A1 Jul. 31, 2014

(51) Int. Cl.
*H01L 21/00* (2006.01)
*B23K 31/02* (2006.01)
(Continued)

(52) U.S. Cl.
CPC ....... *H01L 24/75* (2013.01); *H01L 2224/75502* (2013.01); *H01L 2224/81948* (2013.01); *H01L 2224/75301* (2013.01); *H01L 21/563* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/0401* (2013.01); *H01L 2224/131* (2013.01); *H01L 2224/16225* (2013.01); *H01L 2224/32225* (2013.01); *H01L 2224/73204* (2013.01); *H01L 2224/75252* (2013.01); *H01L 2224/75743* (2013.01); *H01L 2224/75744* (2013.01); *H01L 2224/75745* (2013.01); *H01L 2224/75753* (2013.01); *H01L 2224/81024* (2013.01); *H01L 2224/81121* (2013.01); *H01L 2224/81204* (2013.01); *H01L 2224/81211* (2013.01); *H01L 2224/81815* (2013.01); *H01L 2224/8183* (2013.01);
(Continued)

(58) Field of Classification Search
USPC ................ 228/180.21, 180.22; 438/106–108, 438/612–613
See application file for complete search history.

(56) References Cited

U.S. PATENT DOCUMENTS

| | | | | |
|---|---|---|---|---|
| 5,125,560 A | * | 6/1992 | Degani et al. | 228/223 |
| 5,598,036 A | * | 1/1997 | Ho | 257/738 |

(Continued)

FOREIGN PATENT DOCUMENTS

| | | |
|---|---|---|
| JP | 05-144888 | 6/1993 |
| JP | 2000-150584 | 5/2000 |

(Continued)

OTHER PUBLICATIONS

"Development of a novel Wafer-Level-Packaging technology using laminating process" Yoshio Okayama et.al, Electronic Components and Technology Conference, 2009. ECTC 2009. 59th Digital Object Identifier: 10.1109/ECTC.2009.5074118 Publication Year: 2009, pp. 892-897.

(Continued)

*Primary Examiner* — Devang R Patel
(74) *Attorney, Agent, or Firm* — Derek S. Jennings; Patent Mining Works, LLC

(57) ABSTRACT

A method for packaging a semiconductor device includes attaching a first array of solder material to a first surface of an interposer; bringing the first array of solder material into physical contact with a laminate; and initially bonding the interposer to the laminate by applying a first temperature and pressure gradient to the first array of solder material such that a melting temperature of the first array of solder material is not exceeded.

10 Claims, 7 Drawing Sheets

(51) Int. Cl.
*H01L 23/00* (2006.01)
*H01L 21/56* (2006.01)

(52) U.S. Cl.
CPC ............... *H01L 2224/81906* (2013.01); *H01L 2224/81907* (2013.01); *H01L 2224/92125* (2013.01); *H01L 2924/15311* (2013.01); *H01L 2924/157* (2013.01); *H01L 2924/15787* (2013.01); *H01L 2924/3511* (2013.01); *H01L 2224/8191* (2013.01)

(56) References Cited

U.S. PATENT DOCUMENTS

| | | | |
|---|---|---|---|
| 6,618,938 B1* | 9/2003 | Alagaratnam et al. | 29/840 |
| 6,969,636 B1 | 11/2005 | Fritz | |
| 6,984,792 B2 | 1/2006 | Brofman et al. | |
| 7,049,170 B2* | 5/2006 | Savastiouk et al. | 438/106 |
| 7,148,081 B2 | 12/2006 | Higashino et al. | |
| 7,659,151 B2* | 2/2010 | Corisis et al. | 438/126 |
| 8,104,666 B1* | 1/2012 | Hwang et al. | 228/180.22 |
| 2006/0001179 A1 | 1/2006 | Fukase et al. | |
| 2006/0043603 A1* | 3/2006 | Ranade et al. | 257/778 |
| 2009/0008792 A1 | 1/2009 | Ko et al. | |
| 2009/0275172 A1* | 11/2009 | Suzuki et al. | 438/109 |
| 2011/0084405 A1 | 4/2011 | Suzuki et al. | |
| 2011/0156276 A1 | 6/2011 | Roberts et al. | |
| 2012/0217287 A1 | 8/2012 | Kumar et al. | |

FOREIGN PATENT DOCUMENTS

| | | |
|---|---|---|
| JP | 2008109009 A | 5/2008 |
| JP | 2010103270 A | 5/2010 |
| WO | WO2011020038 A2 | 2/2011 |

OTHER PUBLICATIONS

Application No. PCT/US2014/013112 Filed: Jan. 27, 2014 PCT International Search Report/Written Opinion.

* cited by examiner

3D ASSEMBLY FOR INTERPOSER BOW

BACKGROUND OF THE INVENTION

The present invention generally relates to 3D assembly, and more specifically to 3D assemblies which compensate for interposer bow. The 3D assemblies includes interposers, a laminate and processor chips.

Three-dimensional (3D) integration semiconductor assembly using through-silicon-vias (TSV) and solder bumps provides benefits such as increasing both packaging density and bandwidth due to the short connection lengths.

Silicon interposer warpage during the conventional reflow processes may result in non-wetting of solder bumps and/or bridging between solder joints, thereby decreasing the assembly yield. This influence may become more significant when the chip size increases and the silicon interposer thickness decreases.

For example, FIG. 1 illustrates a conventional bonding process of a silicon interposer 100 with an organic laminate 110. As depicted in the left hand side of FIG. 1, each of an incoming interposer chip 100 and an organic laminate 110 are not perfectly flat. Specifically, the interposer 100 and the laminate 110 are bowed in opposing directions. Subsequently, the interposer chip 100 and organic laminate 110 are placed together and a reflow process (represented by the arrow) takes place. Referring to the right side of FIG. 1, after reflow, the interposer 100 and laminate 110 may not touch. For example, the center region of the interposer fails to make physical contact with the laminate 110, which may result in one or more open connections. Conversely, the edges of the chip may come too close to the laminate surface causing solder ball bridging or shorting.

Therefore, a need exists to mitigate the above described bowing and bridging associated with packaging processes.

BRIEF SUMMARY OF THE INVENTION

According to one aspect of the present invention, a method for packaging a semiconductor device includes attaching a first array of solder material to a first surface of an interposer; bringing the first array of solder material into physical contact with a laminate; and initially bonding the interposer to the laminate by applying a first temperature and pressure gradient to the first array of solder material such that a melting temperature of the first array of solder material is not exceeded.

According to another aspect of the present invention, a method for packaging a semiconductor device includes attaching a first array of solder material to a first surface of an interposer; bringing the first array of solder material into physical contact with a laminate; initially bonding the interposer to the laminate by applying a first temperature and pressure gradient to the first array of solder material such that a melting temperature of the first array of solder material is not exceeded; attaching a second array of solder material to a processor chip; bringing the second array of solder material into physical contact with a second surface of said interposer, wherein the second surface has a plurality of interconnect pads; and initially bonding the interposer to the processor chip by applying a second temperature and pressure gradient to the second array of solder material such that a melting temperature of the second array of solder material is not exceeded.

DETAILED DESCRIPTION OF THE INVENTION

Figure 1:
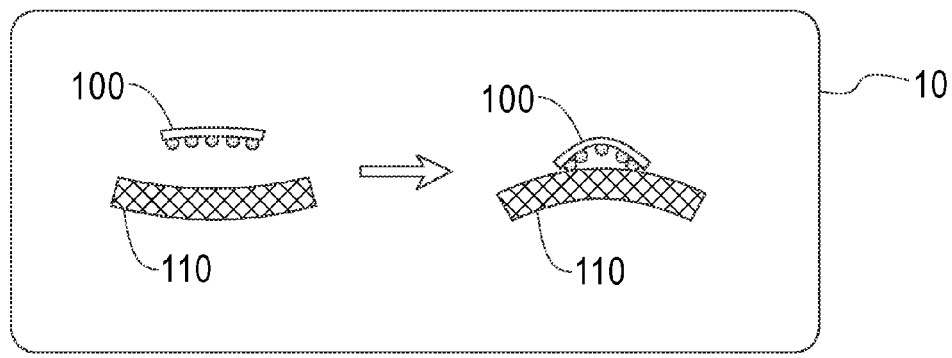
FIG. 1 illustrates a cross sectional view of a typical silicon interposer and substrate to be bonded.

Before describing at least one embodiment of the invention, it may be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. As will be appreciated by one skilled in the art, aspects of the present invention may be embodied as a system, a method or a process.

The following describes and depicts processes that facilitate 3D packaging using initial bonding and the application of differential temperature variations in order to remove the warping of both interposer and substrate components.

Figure 2:
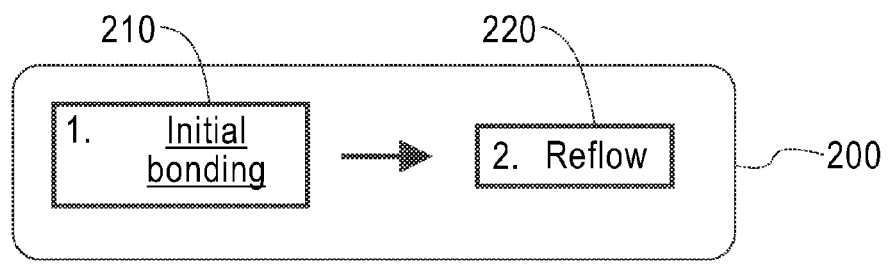
FIG. 2. is a general 3D assembly process in accordance with one embodiment of the present invention.

Referring to FIG. 2, a 3D packaging process 200 according to an embodiment of the invention is depicted. The exemplary 3D packaging process 200 includes an initial bonding process 210 and a subsequent reflow process 220. As depicted on the left hand side of FIG. 2, the initial bonding process 210 involves the application of one or more temperature and pressure gradients to both an interposer and a laminate in order to create an initial bond between the interposer and laminate. The initial bonding may occur because the applied temperature gradients do not melt the solder arrays (controlled collapse chip connection (C4) spheres) connecting the interposer and laminate. More details associated with the initial bonding process 210 will be described with reference to FIGS. 4, 5, and 8A. As depicted on the right hand side of FIG. 2, the reflow process 220 includes the process of applying one or more reflow temperature gradients to both the interposer and the laminate solder ball arrays thereby, creating a permanent bond between the interposer and laminate.

Figure 3:
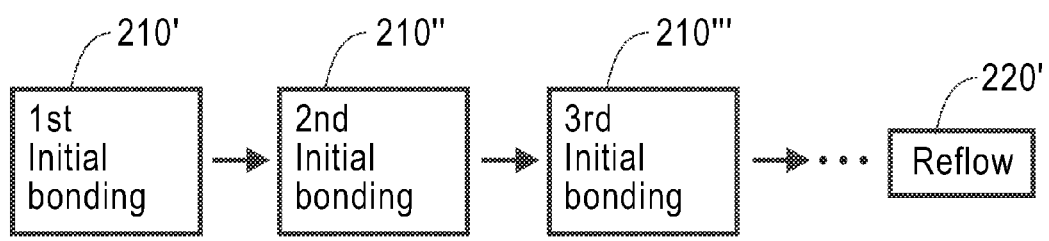
FIG. 3. is an alternative 3D assembly process in accordance with one embodiment of the present invention.

Referring to FIG. 3, an alternative embodiment of the present invention is depicted. The packaging assembly process 200 may have multiple initial bonding processes as indicated by 210', 210", 210''', etc. As explained above, each initial bonding process involves the application of one or more temperature and pressure gradients to both an interposer and a laminate in order to create an initial bond between the interposer and laminate. The reflow process 220' may include the process of applying of one or more reflow temperatures to both an interposer and a laminate in order to create a permanent bond between the interposer and laminate.

Figure 4:
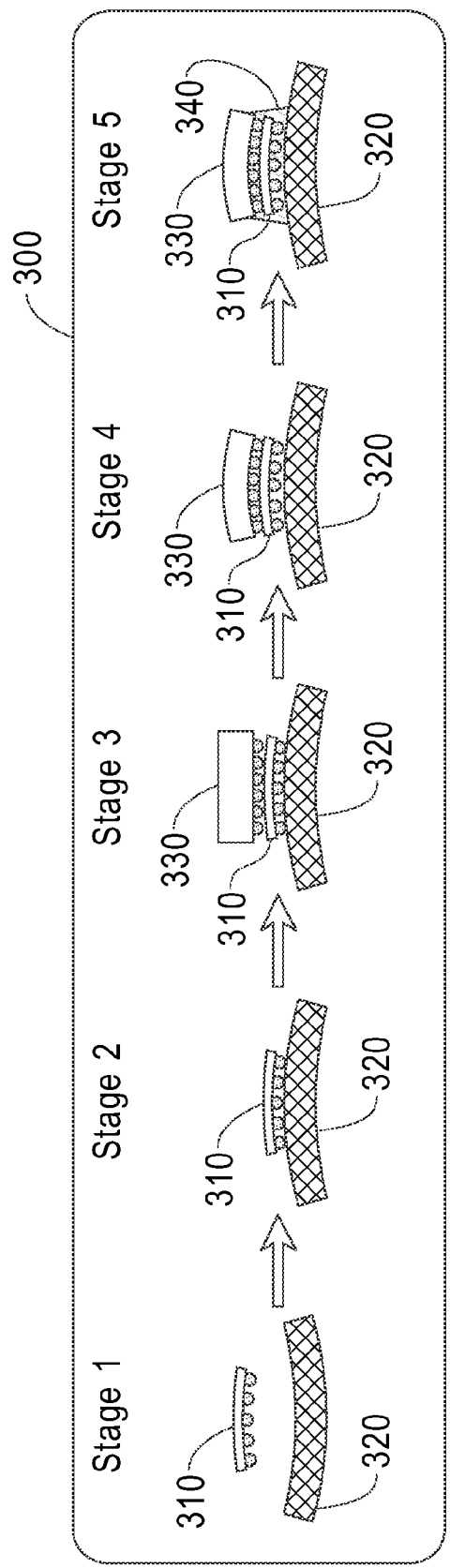
FIG. 4 is a cross sectional view of a detailed 3D assembly process of a silicon interposer and laminate in accordance with one embodiment of the present invention.

Referring to FIG. 4, a 3D assembly process according to an embodiment of the invention includes a 5 stage chip stack process 300. Stage 1 provides a silicon interposer 310 and an organic laminate 320. Stage 2 brings the silicon interposer 310 into contact with the organic laminate 320 to create an initial bond. Stage 3 places a top die 330 on a second surface of the silicon interposer 310 to from a second initial bond with the silicon interposer 310. Once the organic laminate 320, the silicon interposer 310 and the chip top die 330 are aligned via the initial bonding processes the package goes through a reflow process (stage 4). Stage 5 provides an underfill material 340 to encase the interposer 310 and the connections between the organic laminate 320, the interposer 310 and chip top die 330.

Figure 5:
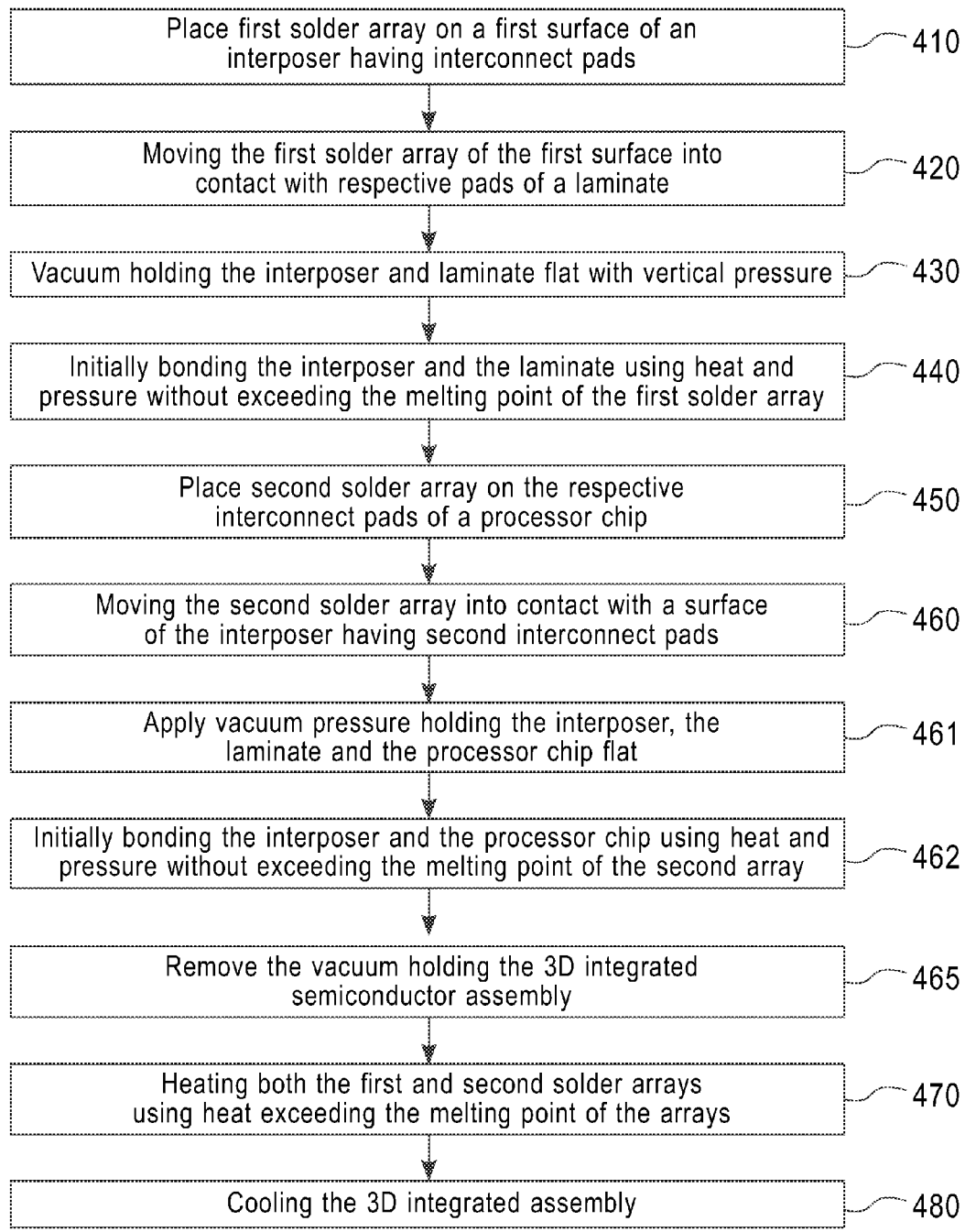
FIG. 5 is a detailed assembly process flow in accordance with one embodiment of the present invention.

Referring to FIG. 5, a 3D integration assembly according to another embodiment of the invention is described. The assembly includes a first process of placing a first solder array material on a first surface of an interposer having respective interconnect pads (410). Once the first solder array material is set, the first solder array and first surface is moved into contact with respective interconnect pads of a laminate (420). Vertical vacuum pressure is applied to hold the interposer and the laminate flat (430). The interposer and the laminate are then initial bonded by applying one or more temperature and pressure gradients to both the interposer and the laminate (440). An initial bond between the interposer and laminate is created because the array of C4 solder material connecting the interposer to the laminate is not reflowed The initial bonding process works by using thermal compression bonding in the form of heat and pressure to create solid state diffusion between the terminal metal of the interconnect pads and their respective solder ball of the solder array. The higher the pressure and the longer the time, the greater the diffusion between the two metals. Further explanation about the initial bonding process will be discussed with reference to FIG. 8A.

Still referring to FIG. 5, the 3D integration assembly further includes placing a second solder array on respective interconnect pads of a processor chip (450). The second solder array material is then moved into contact with a second surface of the interposer having a set of respective interconnect pads (460). A vacuum pressure is applied to hold interposer, the laminate and processor chip flat (461). An additional initial bonding process is applied to the processor chip and the interposer by applying a temperature and pressure gradient without exceeding the melting point of the second solder array material (462). Once the second solder array is positioned, the vacuum holding the 3D semiconductor assembly is removed (465). The 3D integration assembly further includes applying a reflow temperature to the interposer, the laminate, the processor chip, and the solder arrays to exceed the melting point of the solder arrays (470). This creates a wetted solder connection between the interposer, the laminate and the processor chip. The final process for this embodiment is to cool the 3D integrated semiconductor assembly (480).

Other embodiment of the invention may include additional interposers and processor chips as part of the 3D integration assembly According to various embodiments of the present invention the laminate can be either a silicon, an organic laminate, a composite, or ceramic.

Figure 6:
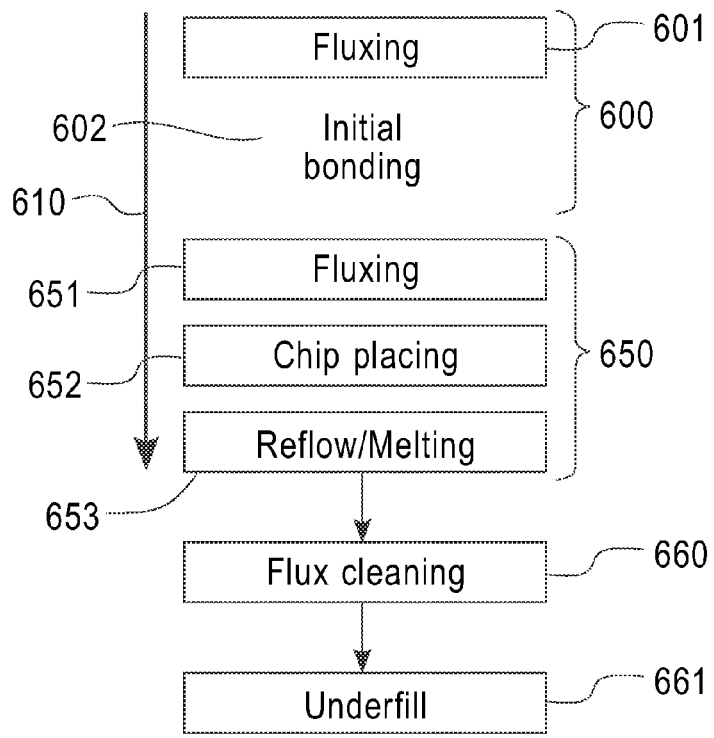
FIG. 6 is another detailed assembly flow process in accordance with one embodiment of the present invention.

Referring to FIG. 6, another 3D assembly process 610 is shown. A first sub process 600 may include fluxing a laminate substrate (601) and initial bonding an interposer with the laminate substrate (602). The assembly process 610 further includes another sub process 650. The sub process 650 includes fluxing the initial bonded interposer (651). Sub process 650 further includes chip placement (652) and conducting a reflow on the entire assembled package (653). The assembly process 610 flux cleans (660) the assembled package and provides an underfill (661). Again, the initial bonding process is used for 3D assembly to maintain planarity and prevent solder bridging. The initial bonding process (602) is added to the known processes of fluxing (601). It should be noted that the fluxing step (651) may apply to fluxing either a first or second solder array. During the fluxing process, a thin film of flux, which contains chemicals that help clean surface oxides and reduce solder wetting angles is applied to the solder array.

Figure 7:
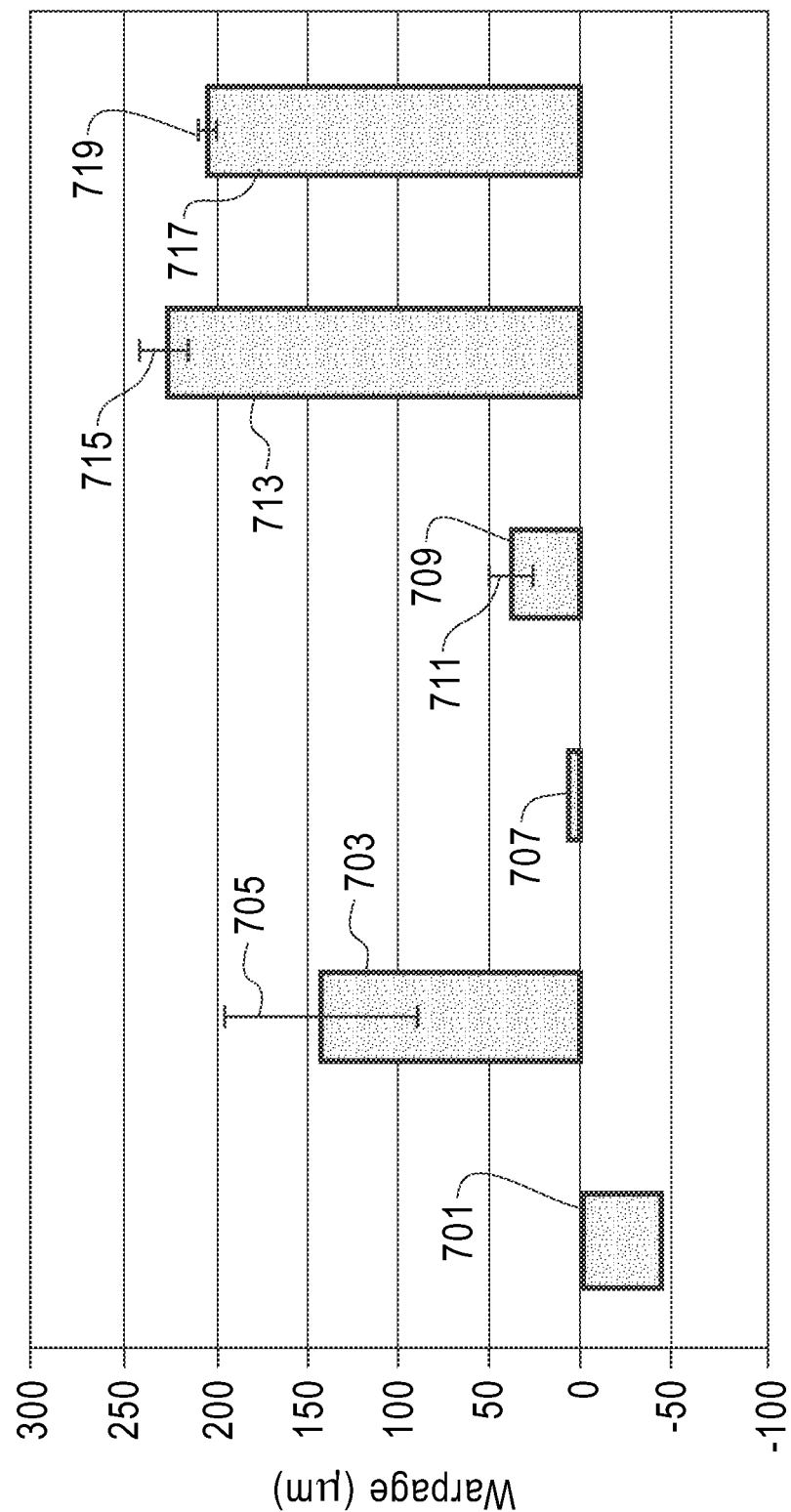
FIG. 7 illustrates warpage change during a chip stack process in accordance with one embodiment of the present invention.

Referring to FIG. 7, warpage changes for a chip stack process according to an embodiment of the invention is depicted. A laminate 701 may have a negative warpage of about −45 um. The warpage for an interposer 703, which may be positive, is about 145 um. Depending on the material used, the interposer 703 could have a variance 705 in warpage. This results in having an interposer 703 having a warpage range from about 90 um to 190 um. The warpage for a silicon chip top die may be about 10 um. As the 3D integrated assembly starts according to the embodiments of the present invention, the initial bonded laminate 701 and the interposer 703 may have a warpage 709 of about 45 um. The initial bonded laminate 701 and the interposer 703 could have a variance 711. This results in the initial bonded laminate and interposer package 709 having a warpage range from about 25 um to 50 um. The 3D integrated assembly package according to the embodiments of the present invention prior to the underfill has a warpage 713 of about 225 um. As mentioned above, depending on the materials used for the 3D integrated assembly package, the warpage 715 could have a range from 210 um to 240 um. The final 3D integrated assembly package according to the embodiments of the present invention, which includes the underfill stage, has a warpage 717 of about 205 um. Again, depending on the materials used for the 3D integrated assembly package, the final warpage 719 for the package could range from 200 um to 210 um.

Figure 8A:
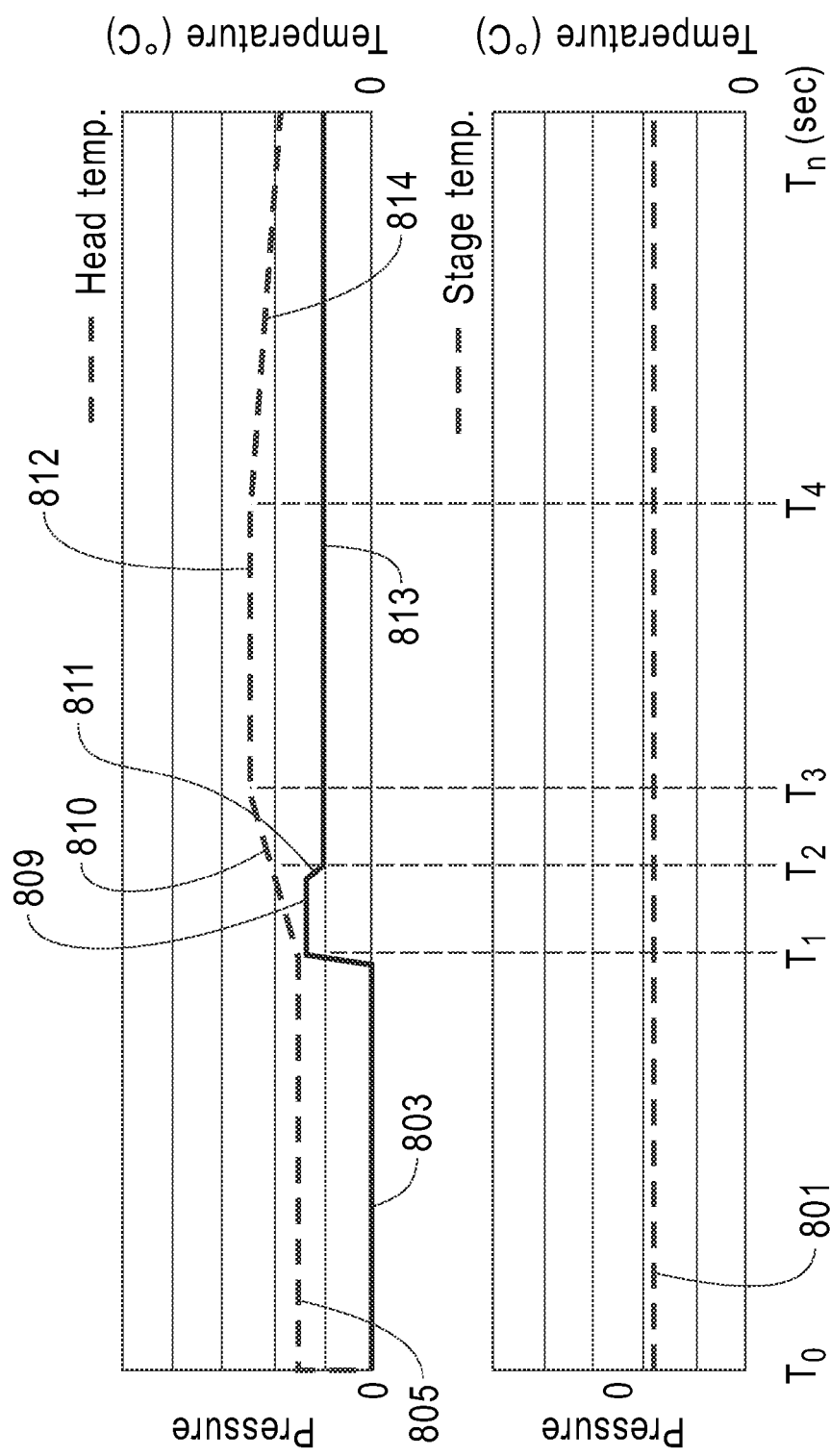
FIG. 8A illustrates a differential pressure/heating/cooling initial bonding profile in accordance with one embodiment of the present invention.

Referring to FIG. 8A, differential heating/cooling and pressure for initial bonding according to an embodiment of the invention is depicted. The initial bonding process is performed by a thermal compression tool. The tool consists of a vacuum bias base stage with heating capability. The tool has a top head which also contains vacuum and heating and cooling capability. The top head also has the capability of vertical movement which allows for the ability to apply vertical pressure on the elements to be assembled. The tool has a pick and place auto alignment vision system with placement accuracy of approximately three microns.

According to the embodiments of the present invention, a stage temperature 801 holding a 3D integrated assembly package can be up to 200° C. The stage temperature 801 may be held constant during the initial bonding process. The amount of pressure applied to the 3D integrated assembly package varies and will be described in stages. Initially, the pressure applied to the 3D integrated assembly package is zero (803). As a heating pressure head moves in a negative Z direction towards the 3D integrated assembly package it is heated to a temperature range of up to 300 C (805). The rate of head movement is slowed as it approaches the 3D integrated assembly package. Once the heated head makes contact at $T_1$ with the 3D integrated assembly package a pressure of up to 200N is applied based on the contact area and materials to be interconnected (809). The head temperature then begins a temperature ramp up at a rate of greater than 10 C/s. Half way through the temperature ramp up the pressure is ramped down at $T_2$ to a critical steady state pressure (811 and 813). This insures good contact of interconnects for good solderability but is low enough to not cause solder bridging or shorting. The critical steady state pressure is a function of the size and number of solder array interconnects. At $T_3$, the top head of the thermal compression tool temperature reaches its steady state temperature of up to 250 C (812). The temperatures applied to the 3D integrated assembly package is such that the arrays of solder do not wet or melt. At $T_4$ the temperature applied to the 3D integrated assembly package is gradually reduced by up to 30 C per second until $T_n$ is reached. The differential heating and cooling parameters are adjusted to insure that the heat and pressure do not result in the melting temperature of solder. Process parameter ranges are specified for the 3D package assembly because the temperatures and pressures will vary with die size, die thickness, the number of C-4 in the solder ball array, the diameter of the individual C-4's in the solder ball array and the laminate material, size and thickness. The range of temperatures and pressures specified in this embodiment were used on interposers up to thirty millimeters square with solder ball arrays of up to fifty thousand C-4's. The typical range of the C-4 solder ball diameters used was from 20 microns to 125 five microns. The interposer used in an embodiment of the present invention had thickness down to 30 microns.

In a preferred embodiment of the present of the present invention, the following parameters are used. The stage temperature was held constant at 180 C throughout the initial bonding process (801). The heating/pressure head is initially heated to a temperature of 150 C. Once the heated head makes contact at $T_1$ with the 3D integrated assembly package, a pressure of 1.3N is applied based on the contact area and materials to be interconnected (809). The head temperature then begins a temperature ramp up at a rate of 50 C/s (810). Half way through the temperature ramp up the pressure is ramped down at $T_2$ to a critical steady state pressure (811 and 813). This insures good contact of interconnects for good solderability but is low enough to not cause solder bridging shorting or shorting. As previously, mention the critical steady state pressure is a function of the size and number of solder array interconnects. At $T_3$, the assembly package temperature reaches its steady state temperature of 235 C (812). The temperatures applied to the 3D integrated assembly package are such that the arrays of solder do not wet or melt. At $T_4$ the temperature applied to the 3D integrated assembly package is gradually reduced by 10 C per second until $T_n$ is reached (814).

Figure 8B:
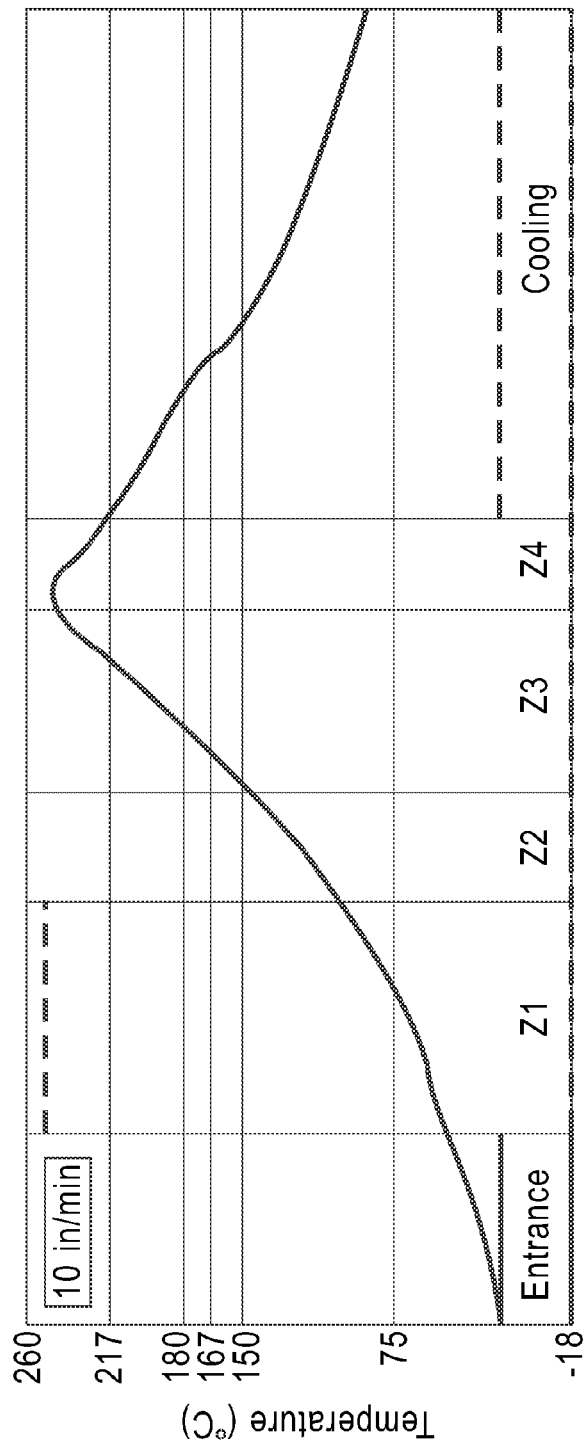
FIG. 8B illustrates a furnace reflow profile in accordance with one embodiment of the present invention.

Referring to FIG. 8B depicts a reflow profile for permanent bonding of the C-4 solder balls in the 3D integrated assembly according to an embodiment of the present invention. As the 3D integrated assembly enters a reflow machine (not shown) the initial reflow temperature is 20 C. During a Z1 period the reflow furnace temperature is 250 C. This causes the temperature of the 3D integrated assembly to rise to a temperature of about 80 C. During a Z2 period, the reflow furnace temperature is raised to 300 C. The 3D integrated assembly has traveled 48 inches and reaches a temperature of 145 C. As the 3D integrated assembly enters a Z3 period, the reflow furnace temperature is raised to 380 C. Once the 3D integrated assembly reaches the Z4 period, its temperature peaks at about 250 C as the reflow furnace temperature reaches 460 C. A cooling period allows the 3D integrated assembly to gradually cool. The advantage of this process is that you can permanently interconnect large die in a 3D assembly package without use of weights during the reflow process.

Figures 9, 10:
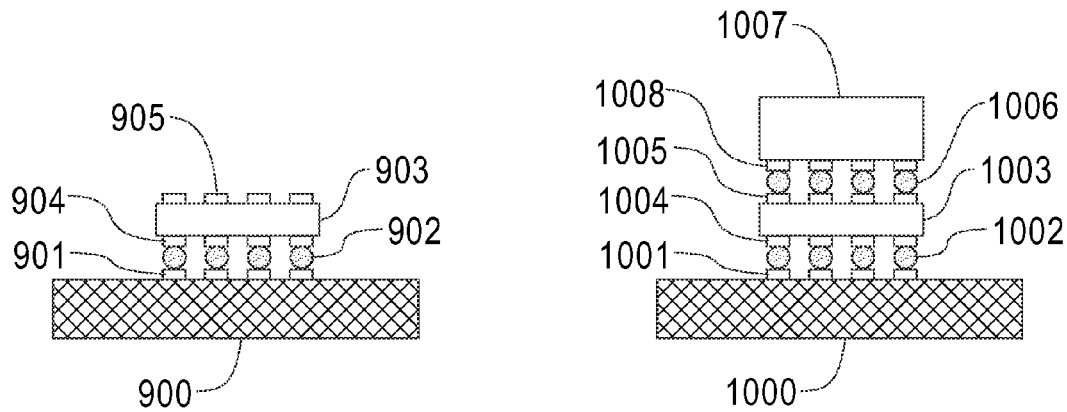
FIG. 9 illustrates a cross sectional view of a semiconductor structure in accordance with one embodiment.
FIG. 10 illustrates a cross sectional view of a semiconductor structure in accordance with one embodiment.

Referring to FIG. 9, a semiconductor structure according to an embodiment of the invention is depicted. The semiconductor structure includes a substrate 900 having plurality of terminal pads 901. The semiconductor structure further includes a silicon interposer 903 having a plurality of terminal pads 904 on a first surface of the silicon interposer 903. The silicon interposer 903 includes a second set of a plurality of terminal pads 905 on a second surface of the silicon interposer 903. The semiconductor structure further includes an array of solder material 902 placed between terminal pads 901 and terminal pads 904. The silicon interposer 903 is initially bonded to the substrate 900 via the solder material array 902. The initial bond occurs because the semiconductor structure is exposed to the application of one or more temperature and pressure gradients to allow for solid state diffusion of the solder balls to the terminal metal of interconnect pads 902.

Referring to FIG. 10, an alternative a semiconductor structure according to an embodiment of the invention is depicted. The semiconductor structure includes a substrate 1000 having plurality of terminal pads 1001. The semiconductor structure further includes a silicon interposer 1003 having a plurality of terminal pads 1004 on a first surface of the silicon interposer 1003. The silicon interposer 1003 includes a second set of a plurality of terminal pads 1005 on a second surface of the silicon interposer 1003. The semiconductor structure further includes a first array of solder material 1002 placed between terminal pads 1001 and terminal pads 1004. The semiconductor structure still further includes a chip top die 1007 having a plurality of terminal pads 1008. A second array of solder material 1006 is placed between the plurality of terminal pads 1008 and the plurality of terminal pads 1005 of the silicon interposer 1003. The chip top die 1007, silicon interposer 1003 and the substrate 1000 are initially bonded to each other via the solder arrays (1002 and 1006). The initial bond occurs because the semiconductor interconnect structure is exposed to the application of one or more temperature and pressure gradients over a critical period of time to create solid state diffusion at the contact interface of the metals. For solid state diffusion, the temperature is held to below the liquid temperature point of the solder alloy.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for packaging a semiconductor device comprising:
   attaching a first array of solder material to a first surface of an interposer; bringing the first array of solder material into physical contact with a laminate;
   initially bonding the interposer to the laminate by applying a first temperature and pressure gradient to the first array of solder material by a thermal compression head such that a melting temperature of the first array of solder material is not exceeded;
   attaching a second array of solder material to a processor chip;
   bringing the second array of solder material into physical contact with a second surface of said interposer, wherein said second surface has a plurality of interconnect pads; and
   initially bonding the interposer to the processor chip by applying the first temperature and pressure gradient to the second array of solder material by the thermal compression head such that a melting temperature of the second array of solder material is not exceeded, wherein during said initial bonding steps, temperature of the thermal compression head includes a ramp up rate of greater than 10° C./s after making contact with materials to be bonded and the pressure is ramped down to a critical steady state pressure.

2. The method of claim 1, wherein said laminate is an organic laminate.

3. The method of claim 1, wherein said laminate comprises silicon.

4. The method of claim 1 wherein said laminate is ceramic.

5. The method of claim 1, wherein said laminate is a composite material.

6. The method of claim 1, wherein said first temperature is up to 250 C.

7. The method of claim 1, wherein said pressure is up to 1.3N.

8. The method of claim 1, further comprises:
   applying a second temperature and pressure gradient to the first and second array of solder materials such that a melting temperature of the first and second array of solder material is exceeded, wherein the processor chip is permanently bonded to the interposer and the interposer is permanently bonded to the laminate.

9. The method of claim 8, wherein said second temperature is up to 460 C.

10. The method of claim 9, further comprises:
    providing an underfill material to cover said first and second array of solder materials and said interposer.

* * * * *